(12) United States Patent
Wei et al.

(10) Patent No.: US 10,135,392 B2
(45) Date of Patent: Nov. 20, 2018

(54) SPIN TORQUE OSCILLATOR WITH HIGH POWER OUTPUT AND ITS APPLICATIONS

(71) Applicant: INSTITUTE OF PHYSICS, CHINESE ACADEMY OF SCIENCES, Beijing (CN)

(72) Inventors: Hongxiang Wei, Beijing (CN); Jiafeng Feng, Beijing (CN); Xiaoguang Zhang, Beijing (CN); Houfang Liu, Beijing (CN); Xiufeng Han, Beijing (CN)

(73) Assignee: INSTITUTE OF PHYSICS, CHINESE ACADEMY OF SCIENCES, Beijing (CN)

( * ) Notice: Subject to any disclaimer, the term of this patent is extended or adjusted under 35 U.S.C. 154(b) by 128 days.

(21) Appl. No.: 15/276,940

(22) Filed: Sep. 27, 2016

(65) Prior Publication Data

US 2018/0006657 A1  Jan. 4, 2018

(30) Foreign Application Priority Data

Jul. 4, 2016  (CN) .......................... 2016 1 0517955

(51) Int. Cl.
| | |
|---|---|
| *H03B 15/00* | (2006.01) |
| *B82Y 25/00* | (2011.01) |
| *H01F 10/32* | (2006.01) |
| *H01L 43/08* | (2006.01) |
| *H01F 10/193* | (2006.01) |

(52) U.S. Cl.
CPC .......... *H03B 15/006* (2013.01); *H01L 43/08* (2013.01); *B82Y 25/00* (2013.01); *H01F 10/193* (2013.01); *H01F 10/329* (2013.01); *H01F 10/3254* (2013.01)

(58) Field of Classification Search
CPC ..... H03B 15/006; H01L 43/08; G11B 5/3903; H01F 10/3254; H01F 10/193; H01F 10/329; B82Y 25/00; G01R 33/093; G01R 33/1284; Y10T 428/1114; Y10T 428/1121

See application file for complete search history.

(56) References Cited

U.S. PATENT DOCUMENTS

| | | | | |
|---|---|---|---|---|
| 7,764,136 B2 * | 7/2010 | Suzuki | ..................... | H01L 43/08 257/421 |
| 8,082,130 B2 * | 12/2011 | Guo | ....................... | B82Y 10/00 703/2 |
| 8,194,361 B2 * | 6/2012 | Kudo | ..................... | B82Y 25/00 360/324.11 |
| 8,754,717 B2 * | 6/2014 | Lee | ........................ | B82Y 25/00 331/187 |
| 2004/0207961 A1 * | 10/2004 | Ichimura | ................ | B82Y 10/00 360/324.2 |
| 2009/0322419 A1 * | 12/2009 | Maehara | ........... | H01L 29/66984 330/60 |

\* cited by examiner

*Primary Examiner* — Ryan Johnson
(74) *Attorney, Agent, or Firm* — Lando & Anastasi, LLP

(57) ABSTRACT

The present invention relates to a spin torque oscillator with high power output and its applications. A spin torque oscillator may include a first magnetic reference layer having a fixed magnetization, a magnetic precession layer having a magnetization capable of precessing about an initial direction, and a first barrier layer interposed between the first magnetic reference layer and the magnetic precession layer. The first barrier layer is formed of an insulating material capable of inducing a negative differential resistance for the spin torque oscillator.

15 Claims, 7 Drawing Sheets

200

| Applying a DC bias to the magnetic tunnel junction to operate it in the negative differential resistance region | 210 |

| Extracting an oscillating signal from the magnetic tunnel junction | 220 |

FIG. 3

SPIN TORQUE OSCILLATOR WITH HIGH POWER OUTPUT AND ITS APPLICATIONS

CROSS-REFERENCE TO RELATED APPLICATIONS

This application claims priority under 35 U.S.C. § 119 to Chinese Patent Application No. 201610517955.3 titled "SPIN TORQUE OSCILLATOR WITH HIGH POWER OUTPUT AND ITS APPLICATIONS" filed on Jul. 4, 2016, the disclosure of which is incorporated herein by reference in its entirety.

FIELD OF THE INVENTION

The present invention generally relates to spintronics, and in particular, to a spin torque oscillator (STO) with high power output and an electronic device including the spin torque oscillator.

BACKGROUND

In 2003, Kiselev et al. observed that when a spin-polarized direct current (DC) flowed through a giant magnetoresistance (GMR) multilayer of nano-size, it would develop a spin transfer torque (STT) that could oscillate magnetization of a free layer included in the GMR multilayer, thereby generating a high frequency output signal under certain conditions (see Kiselev S I, Sankey J C, Kirvorotov I N, et al. Microwave Oscillations of a Nanomagnet driven by driven by a Spin-polarized Current. Nature, 2003, 425:380). This phenomenon has been utilized to make a spin torque oscillator (STO). The spin torque oscillator has many advantages such as a simple structure, a smaller size (one fiftieth or so of a prior art crystal oscillator), a wide range of frequency modulation (0.1-100 GHz), ease of integration, a lower operating voltage (<0.5V), and the like. The spin torque oscillator has successfully overcome many problems associated with conventional LC oscillators and crystal oscillators and thus it is deemed as a candidate of the next generation of oscillators and being researched widely.

Though, the spin torque oscillator has its own defects, i.e., a relatively low output power. The output power of the spin torque oscillator is proportional to a square of magnetoresistance of a GMR spin valve element or a magnetic tunnel junction (MTJ) element constituting a core part of the spin torque oscillator, and now even a spin torque oscillator made of a MTJ element having a relatively high magnetoresistance has only an output power on the order of nanowatt (nW), which is much lower than the order of milliwatt (mW) required for practical use. In 2013, Zeng Z M et al. achieved an output power up to 63 nW with a novel magnetic tunnel junction configuration (see Zeng Z M, Finocchio G, Zhang B, et al. Ultralow-current-density and bias-field-free spin-transfer nano-oscillator. Sci Rep, 2013, 3:1426). However, this is still far below the output power requirement of the spin torque oscillator desired for practical use.

SUMMARY OF THE INVENTION

Some embodiments of the present invention provide a spin torque oscillator comprising: a first magnetic reference layer having a fixed magnetization; a magnetic precession layer having a magnetization capable of precessing about an initial direction; and a first barrier layer interposed between the first magnetic reference layer and the magnetic precession layer, the first barrier layer being formed of an insulating material capable of inducing a negative differential resistance for the spin torque oscillator.

Some embodiments of the present invention provide a spin torque oscillator circuit comprising: a first magnetic tunnel junction element to generate a oscillating signal under a DC bias, comprising: a first magnetic reference layer having a fixed magnetization; a magnetic precession layer having a magnetization precessing about an initial direction under the DC bias; and a first barrier layer interposed between the first magnetic reference layer and the magnetic precession layer, the first barrier layer being formed of an insulating material that induces a negative differential resistance for the first magnetic tunnel under the DC bias; and at least one amplifying circuit to receive and amplify the oscillating signal generated from the first magnetic tunnel junction element, the at least one amplifying circuit each comprising a resistor and a second magnetic tunnel junction element connected in series between a supply voltage and a ground potential, the second magnetic tunnel junction element having a negative differential resistance under biasing of the supply voltage, the oscillating signal being applied to a supply voltage side of the at least one amplifying circuit, and the at least one amplifying circuit providing an amplified oscillating signal at a node between the resistor and the second magnetic tunnel junction element.

Some embodiments of the present invention provide a method of operating a spin torque oscillator, the spin torque oscillator comprising: a first magnetic reference layer having a fixed magnetization; a magnetic precession layer having a magnetization capable of precessing about an initial direction; and a first barrier layer interposed between the first magnetic reference layer and the magnetic precession layer, the first barrier layer being formed of an insulating material capable of inducing a negative differential resistance for the spin torque oscillator, the method comprising: applying a DC bias to the spin torque oscillator to make it operate in a negative differential resistance region; and extracting a oscillating signal output from the spin torque oscillator.

BRIEF DESCRIPTION OF THE DRAWINGS

FIG. 3 is a flow chart showing a method for operating a spin torque oscillator according to an exemplary embodiment of the present invention.

DETAILED DESCRIPTION OF THE EMBODIMENTS

Exemplary embodiments of the present invention will be described below with reference to the accompanying drawings.

Figure 1:
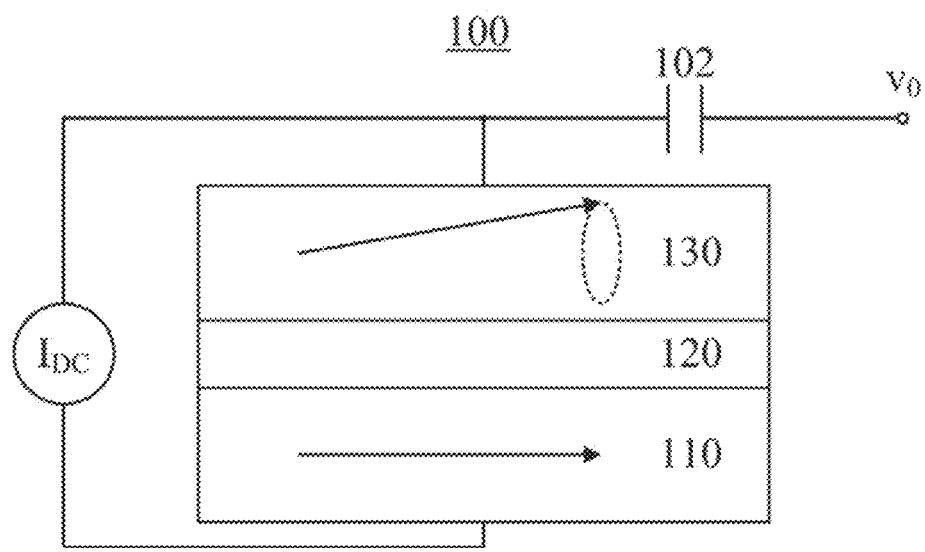
FIG. 1 is a diagram showing a spin torque oscillator according to an exemplary embodiment of the present invention.

FIG. 1 schematically shows a spin torque oscillator 100 according to an exemplary embodiment of the present invention. As shown in FIG. 1, the spin torque oscillator 100 includes a magnetic reference layer 110, a magnetic precession layer 130 and a barrier layer 120 interposed between the magnetic reference layer 110 and the magnetic precession layer 130, which constitute a magnetic tunnel junction. The spin torque oscillator 100 has the magnetic tunnel junction structure and therefore may also be referred to as a magnetic tunnel junction 100.

The magnetic reference layer 110 may be formed of a ferromagnetic material and have a fixed magnetization as shown by the solid-line arrow in FIG. 1. The magnetization of the magnetic reference layer 110 may be fixed by an antiferromagnetic pinning layer (not shown) provided on a side of the magnetic reference layer 110 opposite to the barrier layer 120, or it may be fixed by the magnetic reference layer 110 itself (so called self-pinning configuration). For example, the magnetic reference layer 110 may be formed of a magnetic hard material with a relatively high coercive force, or the magnetic reference layer 110 may be formed to a relatively large thickness. Examples of ferromagnetic materials that may be used to form the magnetic reference layer 110 include but are not limited to Fe, Co, Ni and alloys containing Fe, Co or Ni such as CoFe, NiFe, CoFeB, CoFeAl, CoFeSiAl, CoFeNiAl, NdFeB, or the like.

The magnetic precession layer 130 may also be formed of a ferromagnetic material and have magnetization in an initial direction. Though, when the spin torque oscillator 100 is under a DC bias, the magnetization of the magnetic precession layer 130 can perform a precession motion due to a spin transfer torque (STT) which will be discussed in more detail below, and therefore it is referred to as a magnetic precession layer. Examples of ferromagnetic materials that may be used to form the magnetic precession layer 130 include but are not limited to Fe, Co, Ni and alloys containing Fe, Co or Ni such as CoFe, NiFe, CoFeB, CoFeAl, CoFeSiAl, CoFeNiAl, NdFeB, or the like. In some embodiments, the magnetic precession layer 130 may have a coercive force lower than that of the magnetic reference layer 110. For example, the magnetic precession layer 130 may be formed of a magnetic soft material.

The barrier layer 120 may be formed of an insulating material and thus the spin torque oscillator 100 is of a magnetic tunnel junction structure. It is well known that the magnetic tunnel junction structure is preferable for the spin torque oscillator 100 because it has a much higher magnetoresistance than a spin valve structure in which the insulating barrier layer is replaced by a conductive layer and can generate an oscillating output signal with a higher power.

As shown in FIG. 1, when a DC biasing current $I_{DC}$ is applied to the spin torque oscillator 100, the current $I_{DC}$ may become polarized in the magnetic reference layer 110, developing a spin-polarized current. When the spin-polarized current passes through the magnetic precession layer 130, it applies a spin transfer torque (STT) on the magnetization of the magnetic precession layer 130. If the biasing current $I_{DC}$ is large enough, the magnetization of the magnetic precession layer 130 will precess about its initial direction under the action of the spin transfer torque, as shown by the solid-line arrow rotating along the dashed-line circle in FIG. 1. The precession motion of magnetization of the magnetic precession layer 130 will lead to periodic variation of resistance of the magnetic tunnel junction 100 so that an oscillating signal output $v_O$ may be extracted from one end of the magnetic tunnel junction 100. In the embodiment shown in FIG. 1, the output signal from the end of the magnetic tunnel junction 100 may be provided to a capacitor 102 to filter out a DC component therein, thereby generating an AC output $v_O$.

One critical challenge to develop a spin torque oscillator that can be put into practical use is to increase the power of the AC output signal $v_O$. In embodiments of the present invention, the power of the AC output signal $v_O$ may be increased by choosing a proper material to form the barrier layer 120. Specifically, the barrier layer 120 may be formed of an insulating material that can induce a negative differential resistance for the magnetic tunnel junction 100. A negative differential resistance means that when the voltage increases by an amount of $\Delta v$, instead of increasing, the current decreases by an amount of $\Delta i$, and the differential resistance $\Delta r = \Delta v / \Delta i$ has a negative value, which is known as negative differential resistance, or negative resistance sometimes. In the prior arts, the negative differential resistance may be obtained from semiconductor devices. For example, a tunnel diode or an operational amplifier can have a negative differential resistance.

The inventor found out that when the barrier layer 120 is formed of some particular materials, the magnetic tunnel junction 100 may have a negative differential resistance. Examples of such materials that can be used to form the barrier layer 120 include insulating materials AB having a cubic crystal structure, wherein A represents cation sites in the cubic crystal structure and B represents anion sites in the cubic crystal structure. The cation sites A may occupied disorderedly or randomly by at least two of Mg, Al, Zn and vacancy, and the anion sites B may be occupied by one or more of O, N, Cl, F and vacancy. In addition, the barrier layer 120 may have a thickness in a range of 3 to 10 atomic layers, preferably 4 to 7 atomic layers. If the thickness of the barrier layer 120 is too high, the magnetic tunnel junction 100 cannot exhibit a negative differential resistance; and if the thickness of the barrier layer 120 is too low, pin holes may be formed in the barrier layer 120, which will decrease the magnetoresistance of the magnetic tunnel junction 100 rapidly.

Figure 2A:
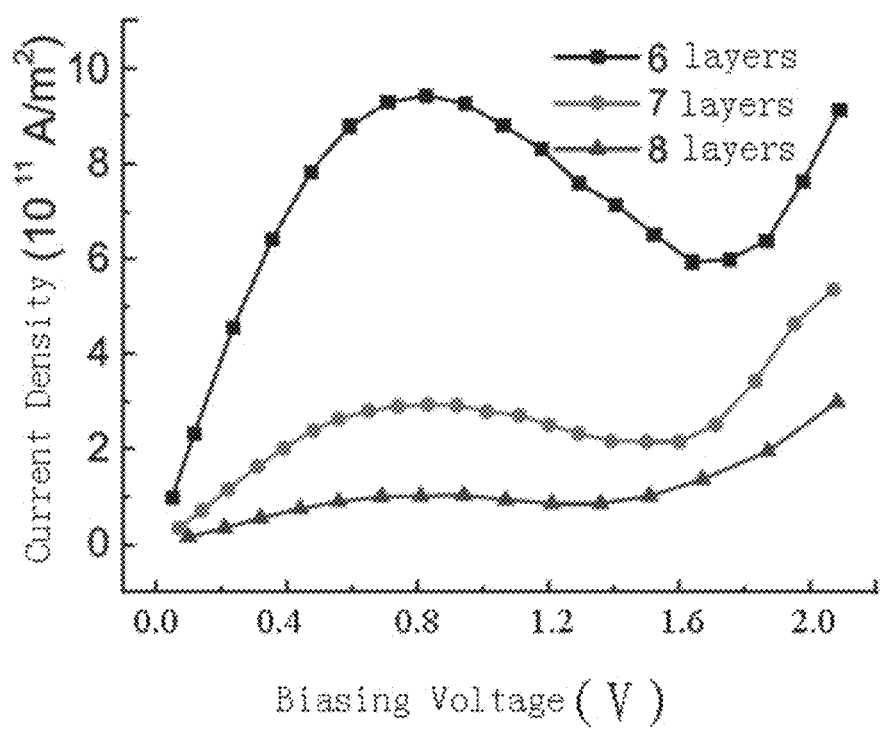
FIGS. 2A and 2B are graphs showing current-voltage (I-V) curves of spin torque oscillators according to some exemplary embodiments of the present invention.
Figure 2B:
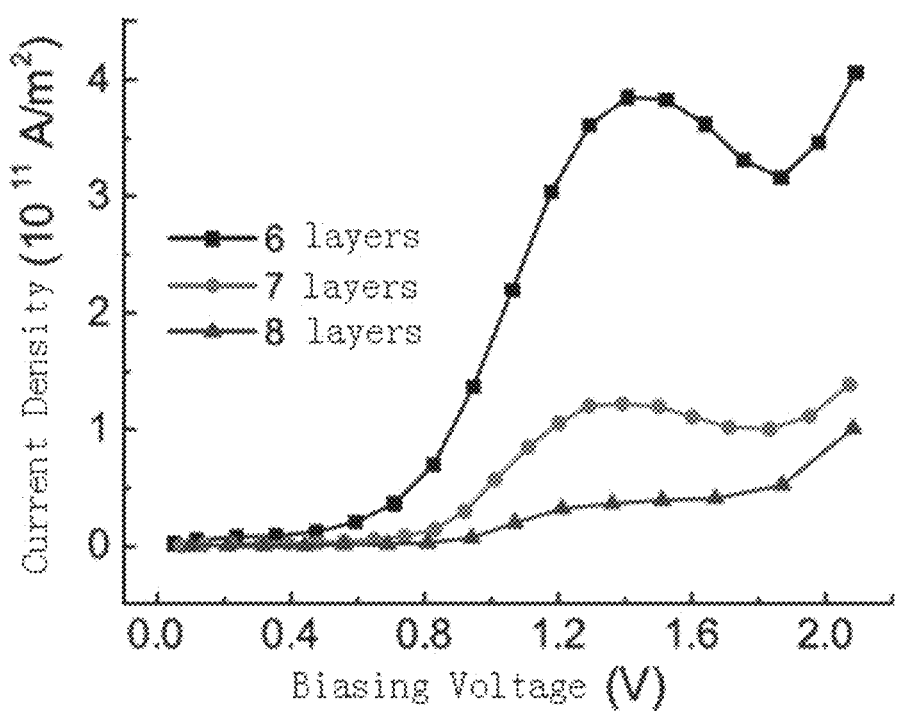

FIGS. 2A and 2B are graphs showing current-voltage (I-V) curves of the spin torque oscillator 100, where FIG. 2A shows a case in which the initial direction of the magnetization of the magnetic precession layer 130 is parallel to the magnetization of the magnetic reference layer 110, and FIG. 2B shows a case in which the initial direction of the magnetization of the magnetic precession layer 130 is anti-parallel to the magnetization of the magnetic reference layer 110. In examples shown in FIGS. 2A and 2B, the magnetic reference layer 110 may be formed of Fe, the barrier layer 120 may be formed of $Al_{0.673}O$, and the magnetic precession layer 130 may be formed of Fe. As shown in FIGS. 2A and 2B, when the barrier layer 120 has a thickness of 6 atomic layers, the spin torque oscillator 100 exhibits a negative differential resistance in a certain voltage range, and the voltage range for the spin torque oscillator 100 to exhibit a negative differential resistance is significantly larger when the spin torque oscillator 100 is in the parallel state than when the spin torque oscillator 100 is in the anti-parallel state. Therefore, in some embodiments of the present invention, the initial magnetization direction of the magnetic precession layer 130 is preferably parallel with the magnetization of the magnetic reference layer 110 in the spin torque oscillator 100. When the thickness of the barrier layer 120 increases to 7 atomic layers, the negative differential resistance decreases significantly; and when the thickness of the barrier layer 120 increases to 8 atomic layers, the negative differential resistance almost disappears.

The negative differential resistance of the spin torque oscillator 100 can be used to amplify the AC output signal $v_o$. Several typical types of resistances will be discussed below. A first type of resistance is a normal resistance R=V/I, e.g., a resistance of a resistor. The normal resistance has a positive value, and the current I passes through the normal resistance in a direction that the voltage V decreases. So, the normal resistance will consume a certain power. A second type is a negative resistance, e.g., a resistance of a power supply device, which has a negative value. That is, the current I passes through the negative resistance in a direction that the voltage V increases. So, the negative resistance (or the power supply device) outputs a certain power. A third type is a negative differential resistance, e.g., the resistance of the above-discussed spin torque oscillator 100, which has a static resistance R=V/I of a positive value indicating that the spin torque oscillator 100 consumes a certain DC power, and a differential resistance $\Delta R = \Delta v / \Delta i$ of a negative value indicating that the AC component $\Delta i$ of the current flows in the direction that the $\Delta v$ increases, so the spin torque oscillator 100 outputs an AC power. That is, when operating in the negative differential resistance state, the spin torque oscillator 100 converts a portion of DC power into AC power, thereby increasing the power of the AC output signal of the spin torque oscillator 100.

For example, referring to FIG. 2A, when the thickness of the $Al_{0.673}O$ barrier layer 120 is 6 atomic layers, the AC signal output by the spin torque oscillator 100 may have a magnitude up to about 0.8 V, and the current density may be about $3 \times 10^{11}$ A/m². Assuming that the spin torque oscillator 100 has a square shape with sides of 100 nm, the AC output power P of the spin torque oscillator 100 may be estimated as below:

$$P = (1/8) \times (100 \times 10^{-9} \text{ m})^2 \times 3 \times 10^{11} \text{ A/m}^2 \times 0.8 \text{V} = 3 \times 10^{-4} \text{ W}$$

The principle for the negative differential resistance to amplify the AC power and the equation to calculate the AC power amplified by the negative differential resistance are also discussed in detail in the entry "negative resistance" of Wikipedia at a web page "https://en.wikipedia.org/wiki/Negative_resistance". As can be seen from the above estimation, the AC output power P of the spin torque oscillator 100 may be as large as about 0.3 milliwatt, which is much larger than the output power of prior art spin torque oscillators. It is to be understood that, of course, the estimated value herein is only a theoretical ideal value and the actual output power of the spin torque oscillator 100 might be lower than the above-estimated value depending on the efficiency of converting DC power to AC power and the internal dissipation of the spin torque oscillator 100 and its associated circuits. However, it is still believed that the output power of the spin torque oscillator 100 operating in the negative differential resistance region will be much larger than the output power of the conventional spin torque oscillator.

FIG. 3 shows a flow chart illustrating a method 200 for operating a spin torque oscillator (e.g., the spin torque oscillator 100 in FIG. 1) including a magnetic tunnel junction according to an embodiment of the present invention. As shown in FIG. 3, the method 200 includes applying a DC bias to the magnetic tunnel junction in a block 210 so as to force the magnetic tunnel junction to operate in the negative differential resistance region. Next, in a block 220, a oscillating signal output may be extracted from the magnetic tunnel junction. In some embodiments, extracting the oscillating signal output from the magnetic tunnel junction may further include filtering out a DC component from the oscillating signal output of the magnetic tunnel junction by a filter, thereby outputting only its AC component. In some embodiments, the filter to filter out the DC component may be a capacitor, for example, the capacitor 102 as described above with reference to FIG. 1. It should be understood that the above-mentioned steps may be carried out concurrently rather than being limited to the above order.

Figure 4:
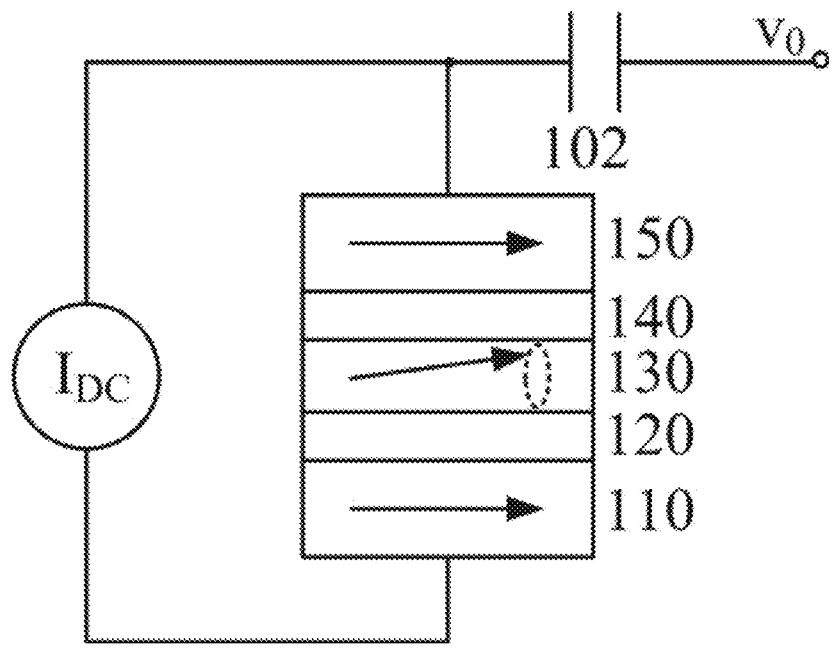
FIG. 4 is a diagram showing a spin torque oscillator according to another exemplary embodiment of the present invention.

FIG. 4 shows a spin torque oscillator 300 according to another embodiment of the present invention. The spin torque oscillator 300 is substantially the same as the spin torque oscillator 100 shown in FIG. 1 except that it has a dual-barrier structure. Therefore, the same elements are denoted by the same reference numerals and their detailed description will be omitted here. As shown in FIG. 4, the spin torque oscillator 300 includes a first magnetic reference layer 110, a first barrier layer 120, a magnetic precession layer 130, a second barrier layer 140 and a second magnetic reference layer 150. The first magnetic reference layer 110, the first barrier layer 120 and the magnetic precession layer 130 may be the same as those described above with reference to FIG. 1 and will not be described any more herein.

The second barrier layer 140 is also formed of an insulating material and interposed between the magnetic precession layer 130 and the second magnetic reference layer 150, forming a dual-barrier structure for the spin torque oscillator 300. The second magnetic reference layer 150 may be formed of a ferromagnetic material and have a fixed magnetization as shown by the solid-line arrow. It should be noted that the magnetization of the second magnetic reference layer 150 should be parallel to the magnetization of the first magnetic reference layer 110 to ensure that a magnetoresistance can be generated. The magnetization of the second magnetic reference layer 150 may also be fixed by an anti-ferromagnetic pinning layer (not shown) formed on a side of the second magnetic reference layer 150 opposite to the second barrier layer 140, or the magnetization of the second magnetic reference layer 150 may be self-pinned. For example, the second magnetic reference layer 150 may be formed of a magnetic hard material with a relatively high coercive force or the second magnetic reference layer 150 may be formed to a relatively large thickness. Examples of ferromagnetic materials that may be used to form the second magnetic reference layer 150 include but are not limited to Fe, Co, Ni and alloys containing Fe, Co or Ni, such as CoFe, NiFe, CoFeB, CoFeAl, CoFeSiAl, CoFeNiAl, NdFeB, and the like. It should be understood that the forming material and thickness of the second magnetic reference layer 150 may be same as or different from the first magnetic reference layer 110.

The second barrier layer 140 may be a barrier layer that can induce a negative differential resistance for the spin torque oscillator 300, as the first barrier layer 120 does. However, it may also be a conventional barrier layer, i.e., a barrier layer that can not induce a negative differential resistance. When the second barrier layer 140 is a conventional barrier layer, the spin torque oscillator 300 may be considered as a structure formed by connecting the spin torque oscillator 100 in FIG. 1 and a conventional magnetic tunnel junction in series. When the second barrier layer 140 is a barrier layer that can induce a negative differential resistance, the spin torque oscillator 300 may be considered as a structure formed by connecting two spin torque oscillators 100 in FIG. 1 in series and oscillating signals of such two spin torque oscillator 100 are always in phase because they are generated due to the precession motion of the magnetization of the same magnetic precession layer 130. In this case, the spin torque oscillator 300 may have a larger output power. It would be understood that even if both the first and second barrier layers 120 and 140 are formed of materials that can induce a negative differential resistance, they may be formed of the same or different materials to the same or different thicknesses.

As compared to the single-barrier spin torque oscillator 100 shown in FIG. 1, the dual-barrier spin torque oscillator 300 shown in FIG. 4 generally has a larger area-resistance product RA, and hence a higher biasing voltage corresponding to the negative differential resistance region, which is advantageous for the oscillator 300 to improve its tolerance to a high voltage. In addition, as the spin torque oscillator 300 has two barrier layers, it would be more flexible to adjust parameters of the oscillator 300. For example, it is possible to modify the slope of the I-V curve in the negative differential resistance region by selecting one or both of the two barrier layers as the barrier layer capable of inducing a negative differential resistance and/or adjusting thicknesses of the barrier layer(s) inducing the negative differential resistance; and it is also possible to adjust the range of the biasing voltage corresponding to the negative differential resistance region by selecting the material for each barrier layer inducing the negative differential resistance. Therefore, with the dual-barrier magnetic tunnel junction structure, it would be easier to make spin torque oscillators that have desirable parameters.

Figure 5:
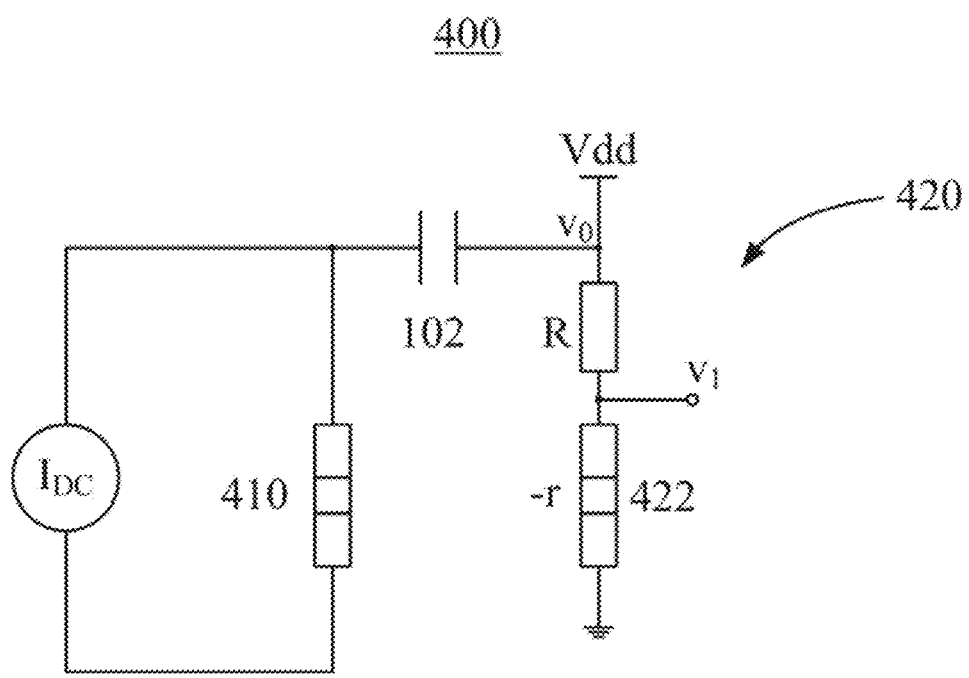
FIG. 5 is a diagram showing a spin torque oscillator circuit according to an exemplary embodiment of the present invention.

It is already known that conventional semiconductor negative differential resistance devices such as tunnel diodes may be used to amplify an AC signal. In some embodiments of the present invention, oscillating signals output by the above-mentioned spin torque oscillators 100, 300 may also be further amplified by a magnetic tunnel junction with a negative differential resistance. FIG. 5 shows a spin torque oscillator circuit 400 according to another embodiment of the present invention.

As shown in FIG. 5, the spin torque oscillator circuit 400 includes a spin torque oscillator 410 and an amplifying circuit 420. The spin torque oscillator 410 may be any one of the spin torque oscillators 100 and 300 as described above and will not be described in detail herein. The high frequency (AC) output signal $v_0$ of the spin torque oscillator 410 may pass through a filter such as the capacitor 102 to filter out the low frequency (DC) component and then be supplied to the amplifying circuit 420 for amplification.

The amplifying circuit 420 includes a resistor R and a magnetic tunnel junction 422 connected in series between the supply voltage Vdd and the ground potential. It would be understood that although FIG. 5 shows the resistor R is disposed on the supply voltage side and the magnetic tunnel junction 422 is disposed on the ground potential side, it is also possible to arrange them inversely, that is, the resistor R may be disposed on the ground potential side and the magnetic tunnel junction 422 may be disposed on the supply voltage side. The high frequency output $v_0$ of the spin torque oscillator 410 may be superposed on the supply voltage Vdd and applied to one end of the amplifying circuit 420 and an output signal $v_1$ may be extracted from a node between the resistor R and the magnetic tunnel junction 422 in the amplifying circuit 420.

Here, the magnetic tunnel junction 422 may be identical to any one of the magnetic tunnel junctions 100 and 300 described above with reference to FIGS. 1 and 4. That is, the magnetic tunnel junction 422 may be a single-barrier or dual-barrier magnetic tunnel junction with a negative differential resistance. The supply voltage Vdd may be set to bias the magnetic tunnel junction 422 in the negative differential resistance region. Therefore, the magnetic tunnel junction 422 may amplify the high frequency output $v_0$ from the spin torque oscillator 410. Specifically, assuming that the magnetic tunnel junction 422 has a negative differential resistance −r, the output signal $v_1$ extracted from the node between the resistor R and the magnetic tunnel junction 422 in the amplifying circuit 420 satisfies the following equation:

$$v_1 = v_0 r/(r-R)$$

Since $r/(r-R)$ is greater than 1, $v_1$ is greater than $v_0$. Thus, the amplifying circuit 420 may amplify the high frequency output $v_0$ of the spin torque oscillator 410.

It is noted that although the magnetic tunnel junction 422 has a negative differential resistance as the spin torque oscillator 410, it differs from the spin torque oscillator 410 in that the magnetic tunnel junction 422 itself does not generate an oscillating signal, and it only amplifies the oscillating signal generated by the spin torque oscillator 410. If the magnetic tunnel junction 422 itself generates an oscillating signal, it is difficult to ensure that the oscillating signal generated by the magnetic tunnel junction 422 can keep in phase with the oscillating signal provided from the spin torque oscillator 410. When the two oscillating signals out-of-phase with each other are superposed, it may cause the superposed signal to have a disordered phase and a reduced power. In order to prevent the magnetic tunnel junction 422 from generating an oscillating signal, it may be formed to have a relatively large junction area, thereby decreasing density of the current flowing therethrough. If the density of the current passing through the magnetic tunnel junction 422 is not high enough, the current cannot induce the precession motion of magnetization of the magnetic precession layer 130 in the magnetic tunnel junction 422, thereby no oscillating signal is generated. Since the magnetic precession layer 130 does not generate magnetization precession in the magnetic tunnel junction 422, it may be called a "magnetic layer" instead. It is to be understood that the "magnetic layer" may be a magnetic free layer with magnetization free to rotate with an external magnetic field or a magnetic reference layer with fixed magnetization.

In the embodiment shown in FIG. 5, both the generation and amplification of the oscillating signal may be carried out by the magnetic tunnel junctions. These magnetic tunnel junctions, such as the magnetic tunnel junction 410 and the magnetic tunnel junction 420, may be formed in the same process steps except that they are formed with different junction areas. Since the junction area may be easily defined in a photolithographic process, the spin torque oscillator circuit 400 shown in FIG. 5 may be manufactured in a simplified process. Furthermore, the magnetic tunnel junction 410 and the magnetic tunnel junction 420 may be formed on the same substrate, which helps to improve integration level of the spin torque oscillator circuit 400 and facilitate further miniaturization thereof.

Although the spin torque oscillator circuit 400 shown in FIG. 5 includes only one amplifying circuit 420, it is to be understood that the spin torque oscillator circuit 400 may also include a plurality of cascaded amplifying circuits 420, e.g., two, three, four or more amplifying circuits 420, which amplify the output signal $v_0$ from the spin torque oscillator 410 in turn. In addition, a filter such as a capacitor may be provided downstream of each amplifying circuit 420 to filter out a DC component in the output signal from the amplifying circuit 420.

Figure 6:
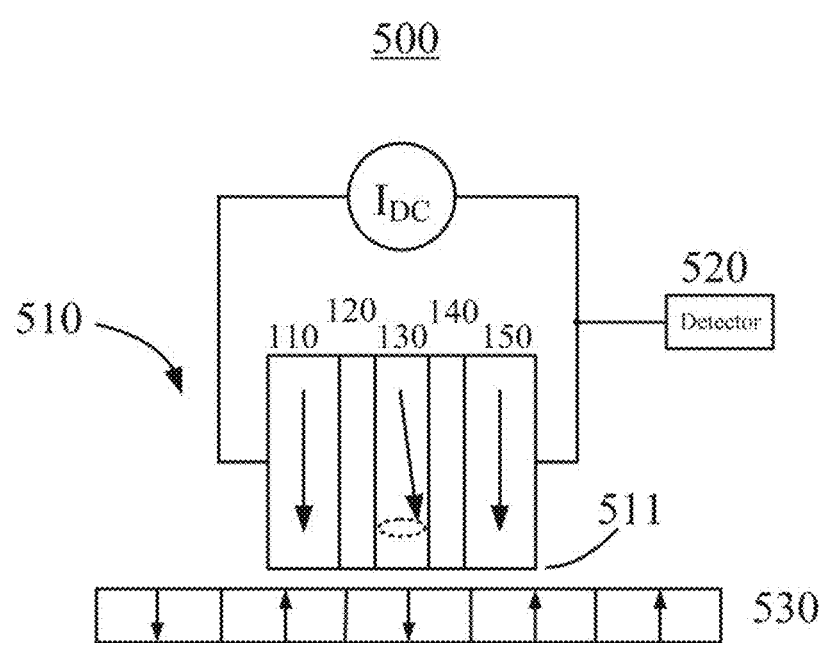
FIG. 6 is a diagram showing a magnetic reading head including a spin torque oscillator according to an exemplary embodiment of the present invention.

The spin torque oscillators and the spin torque oscillator circuits described above may have many applications. In addition to being used in various circuits and devices in place of conventional oscillators such as voltage controlled oscillators (VCOs), crystal oscillators and LC oscillators, the spin torque oscillators and the spin torque oscillator circuits of the present invention may also be used as, for example, magnetic sensors in some magnetic devices. FIG. 6 shows an example of a magnetic reading head 500 that may be used in a magnetic recording device. Referring to FIG. 6, the magnetic reading head 500 may include a spin torque oscillator 510, which is shown to have a structure identical to the spin torque oscillator 300 shown in FIG. 4 and will not be described in detail here. In some other embodiments, the spin torque oscillator 510 may also have a structure identical to the spin torque oscillator 100 shown in FIG. 1. The magnetic reading head 500 may have an air bearing surface (ABS) 511 substantially perpendicular to layers in the spin torque oscillator 510, and the air bearing surface (ABS) 511 may be adjacent to the upper surface of the magnetic recording media 530 so that when the magnetic recording media 530 rotates, the magnetic reading head 500 may fly over the magnetic recording media 530 with a predetermined distance therebetween. The magnetic recording media 530 may have massive magnetic recording bits formed therein and each bit is shown in FIG. 6 to have a perpendicular magnetization as represented by the upward or downward arrows.

When a DC bias is applied to the spin torque oscillator 510, the magnetic precession layer 130 included in the spin torque oscillator 510 may precess at a fundamental frequency in absence of an external magnetic field. When the spin torque oscillator 510 is positioned over the magnetic recording media 530, a magnetic recording bit in the magnetic recording media 530 directly below the spin torque oscillator 510 may apply a magnetic field on the spin torque oscillator 510 so that the precession frequency of the magnetic precession layer 130 may shift from the fundamental frequency. The precession frequency shift of the magnetic precession layer 130 is associated with the magnetization direction of the magnetic recording bit, and thus the magnetization direction of the magnetic recording bit may be determined by the detector 520 detecting the frequency of the AC output signal from the spin torque oscillator 510, thereby reading out data recorded on the magnetic recording media 530.

It is to be understood that the spin torque oscillators and the spin torque oscillator circuits of the present invention may be widely used in electrical and magnetic fields in place of conventional semiconductor oscillators and conventional spin torque oscillators, rather than being limited to the above-mentioned application examples. For example, the spin torque oscillators and the spin torque oscillator circuits of the present invention may also be applied to microwave assisted magnetic recording (MAMR) in which the coercive force of the magnetic recording medium may be decreased instantaneously with microwave generated by the spin torque oscillator to improve writing ability of the magnetic recording head, thereby further increasing the magnetic recording density. With the teaching of the present invention, these applications are obvious for those skilled in the art and can be realized without any creative efforts.

Although the present invention has been described above with reference to exemplary embodiments, the present invention is not limited thereto. For example, while in embodiments shown in figures, the magnetic layers have in-plane magnetizations, the principle of the present invention may also be applied to magnetic tunnel junctions with a perpendicular magnetization configuration. It is obvious to those skilled in the art that many variations and modifications in forms and details may be made without departing from the scope and spirit of the present invention. The scope of the present invention is only defined by the appended claims and their equivalents.

What is claimed is:

1. A spin torque oscillator comprising:
   a first magnetic reference layer having a fixed magnetization;
   a magnetic precession layer having a magnetization capable of precessing about an initial direction; and
   a first barrier layer interposed between the first magnetic reference layer and the magnetic precession layer, the first barrier layer being formed of an insulating material capable of inducing a negative differential resistance for the spin torque oscillator;
   wherein the first barrier layer is formed of a material AB having a cubic crystal structure where A represents cation sites and B represents anion sites in the cubic crystal structure, the cation sites A are occupied disorderly by at least two of Mg, Al, Zn and vacancy, and the anion sites B are occupied by one or more of O, N, Cl, F and vacancy.

2. The spin torque oscillator of claim 1 wherein the first barrier layer has a thickness in a range of 4-7 atomic layers.

3. The spin torque oscillator of claim 1 wherein the initial direction of the magnetization of the magnetic precession layer is parallel to the magnetization of the first magnetic reference layer.

4. The spin torque oscillator of claim 1 further comprising:
   a second barrier layer formed of an insulating material provided on a side of the magnetic precession layer opposite to the first barrier layer; and
   a second magnetic reference layer having a fixed magnetization provided on a side of the second barrier layer opposite to the magnetic precession layer.

5. The spin torque oscillator of claim 4 wherein the second barrier layer is formed of an insulating material capable of inducing a negative differential resistance.

6. The spin torque oscillator of claim 5 wherein the second barrier layer has a thickness in a range of 4-7 atomic layers.

7. The spin torque oscillator of claim 4 wherein the second magnetic reference layer has a magnetization in a direction parallel to the magnetization of the first magnetic reference layer.

8. A spin torque oscillator circuit comprising:
   a first magnetic tunnel junction generating an oscillating signal under a direct current (DC) bias, the first magnetic tunnel junction comprising:
     a first magnetic reference layer having a fixed magnetization;
     a magnetic precession layer having a magnetization capable of precessing about an initial direction under the DC bias; and
     a first barrier layer interposed between the first magnetic reference layer and the magnetic precession layer, the first barrier layer being formed of an insulating material capable of inducing a negative differential resistance under the DC bias; and
   at least one amplifying circuit receiving and amplifying the oscillating signal generated by the first magnetic tunnel junction, each respective at least one amplifying circuit comprising a resistor and a second magnetic tunnel junction connected in series between a supply voltage and a ground potential, the second magnetic tunnel junction having a negative differential resistance under biasing of the supply voltage, the oscillating signal being applied to a supply voltage side of the respective at least one amplifying circuit, the respective at least one amplifying circuit providing the amplified oscillating signal at a node between the resistor and the second magnetic tunnel junction;

wherein the first barrier layer is formed of a material AB having a cubic crystal structure where A represents cation sites and B represents anion sites in the cubic crystal structure, the cation sites A are occupied disorderly by at least two of Mg, Al, Zn and vacancy, and the anion sites B are occupied by one or more of O, N, Cl, F and vacancy, and the first barrier layer has a thickness in a range of 4-7 atomic layers.

9. The spin torque oscillator circuit of claim 8 wherein the second magnetic tunnel junction has a larger junction area than the first magnetic tunnel junction.

10. The spin torque oscillator circuit of claim 8 wherein the second magnetic tunnel junction itself does not generate an oscillating signal.

11. The spin torque oscillator circuit of claim 8 wherein the second magnetic tunnel junction has a multilayer structure identical to the first magnetic tunnel junction.

12. The spin torque oscillator circuit of claim 8 wherein the first magnetic tunnel junction further comprises:

a second barrier layer formed of an insulating material provided on a side of the magnetic precession layer opposite to the first barrier layer; and a second magnetic reference layer having a fixed magnetization provided on a side of the second barrier layer opposite to the magnetic precession layer, wherein the second magnetic reference layer has a magnetization in a direction parallel to the magnetization of the first magnetic reference layer.

13. The spin torque oscillator circuit of claim 8 further comprising:

a filter disposed between the first magnetic tunnel junction and the at least one amplifying circuit to filter out a DC component in the oscillating signal generated by the first magnetic tunnel junction, passing only an AC component of the oscillating signal to the at least one amplifying circuit for amplification.

14. The spin torque oscillator circuit of claim 8 wherein the at least one amplifying circuit comprises two or more amplifying circuits cascaded with each other to amplify the oscillating signal generated by the first magnetic tunnel junction.

15. The spin torque oscillator circuit of claim 14 wherein a filter is connected between adjacent ones of the two or more amplifying circuits cascaded with each other to filter out a DC component in a signal output from each amplifying circuit.

* * * * *